(12) United States Patent
Wada et al.

(10) Patent No.: US 12,477,662 B2
(45) Date of Patent: Nov. 18, 2025

(54) PRINTED WIRING BOARD

(71) Applicant: IBIDEN CO., LTD., Gifu (JP)

(72) Inventors: Kentaro Wada, Ogaki (JP); Koji Kondo, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 279 days.

(21) Appl. No.: 18/182,069

(22) Filed: Mar. 10, 2023

(65) Prior Publication Data

US 2023/0292448 A1    Sep. 14, 2023

(30) Foreign Application Priority Data

Mar. 11, 2022  (JP) .................. 2022-037664

(51) Int. Cl.
*H05K 3/38*    (2006.01)
*H05K 1/11*    (2006.01)
*H05K 3/46*    (2006.01)

(52) U.S. Cl.
CPC ............... *H05K 3/38* (2013.01); *H05K 1/112* (2013.01); *H05K 3/4688* (2013.01)

(58) Field of Classification Search
CPC ........ H05K 3/38; H05K 1/112; H05K 3/4688; H05K 3/386; H05K 3/467; H05K 3/4673; H05K 1/0296; H05K 1/02; H05K 1/0204; H05K 1/0216; H05K 1/0298; H05K 1/0306; H05K 1/0346; H05K 1/036; H05K 1/038; H05K 1/092; H05K 1/113; H05K 1/115; H05K 1/116; H05K 3/0044; H05K 3/06; H05K 3/20; H05K 3/205; H05K 3/207; H05K 3/281; H05K 3/4007; H05K 3/4038; H05K 3/4069; H05K 3/4614; H05K 3/4617; H05K 3/4623; H05K 3/4658; H01L 21/568; H01L 21/4846; H01L 21/4857; H01L 23/3114; H01L 23/49575; H01L 23/49816; H01L 23/49861; H01L 24/02; H01L 24/05; H01L 24/14; H01L 24/27; H01L 24/29; H01L 24/32
USPC ....... 174/250, 255, 258, 259, 260, 262, 266; 361/320; 257/40, 43, 701; 428/209, 413; 438/125; 29/846
See application file for complete search history.

(56) References Cited

U.S. PATENT DOCUMENTS

| 6,420,664 B1 * | 7/2002 | Muramatsu ....... H01L 23/49816 174/262 |
| 2001/0005545 A1 * | 6/2001 | Andou ................... H05K 3/462 428/209 |

(Continued)

FOREIGN PATENT DOCUMENTS

JP    2001-203462 A    7/2001

*Primary Examiner* — Lincoln D Donovan
(74) *Attorney, Agent, or Firm* — Finnegan, Henderson, Farabow, Garrett & Dunner, LLP

(57) ABSTRACT

A printed wiring board includes an insulating layer, a first conductor layer formed on the insulating layer, an adhesive layer formed on the first conductor layer, a resin insulating layer formed on the insulating layer such that the adhesive layer is formed between the first conductor layer and the resin insulating layer, and a second conductor layer formed on the resin insulating layer. The first conductor layer is formed such that the first conductor layer has a smooth upper surface and a smooth side surface and that the adhesive layer has a smooth film formed on the smooth upper and side surfaces, and a protruding part protruding from the smooth film.

20 Claims, 4 Drawing Sheets

(56) References Cited

U.S. PATENT DOCUMENTS

| | | | | |
|---|---|---|---|---|
| 2004/0111882 | A1* | 6/2004 | Nakamura | H01L 21/486 |
| | | | | 174/250 |
| 2005/0280978 | A1* | 12/2005 | Sakaguchi | H01G 9/15 |
| | | | | 361/523 |
| 2006/0213684 | A1* | 9/2006 | Sakata | H01L 23/49572 |
| | | | | 29/846 |
| 2006/0214282 | A1* | 9/2006 | Sakata | H01L 21/4857 |
| | | | | 257/E23.056 |
| 2009/0103236 | A1* | 4/2009 | Nonaka | C04B 26/14 |
| | | | | 524/879 |
| 2009/0183901 | A1* | 7/2009 | Kataoka | H01L 21/4846 |
| | | | | 174/257 |
| 2010/0147576 | A1* | 6/2010 | Hondo | H05K 3/4069 |
| | | | | 174/266 |
| 2013/0192882 | A1* | 8/2013 | Nejime | H05K 1/038 |
| | | | | 174/255 |
| 2015/0214193 | A1* | 7/2015 | Yoshimura | H01L 23/3107 |
| | | | | 257/777 |
| 2015/0214255 | A1* | 7/2015 | Chikama | H01L 27/1248 |
| | | | | 257/43 |
| 2016/0042986 | A1* | 2/2016 | Takamoto | H01L 21/568 |
| | | | | 428/413 |
| 2016/0295707 | A1* | 10/2016 | Takano | H05K 1/115 |
| 2016/0303829 | A1* | 10/2016 | Arai | C25D 5/617 |
| 2016/0353576 | A1* | 12/2016 | Kusama | H01L 23/3142 |
| 2016/0380226 | A1* | 12/2016 | Hayashi | H10K 50/814 |
| | | | | 257/40 |
| 2017/0277290 | A1* | 9/2017 | Murakami | H05K 3/207 |
| 2017/0293382 | A1* | 10/2017 | Ishii | G06F 3/041 |
| 2017/0338198 | A1* | 11/2017 | Jang | H01L 24/27 |
| 2018/0084640 | A1* | 3/2018 | Noto | H01F 27/2804 |
| 2018/0084641 | A1* | 3/2018 | Noto | H01F 27/2804 |
| 2018/0213644 | A1* | 7/2018 | Noto | H05K 1/116 |
| 2020/0037443 | A1* | 1/2020 | Matsuda | B32B 38/10 |
| 2021/0126186 | A1* | 4/2021 | Kitada | H10N 30/2047 |
| 2021/0410272 | A1* | 12/2021 | Yamauchi | H05K 1/0216 |
| 2022/0289976 | A1* | 9/2022 | Ogasawara | C09J 7/35 |

* cited by examiner

PRINTED WIRING BOARD

CROSS-REFERENCE TO RELATED APPLICATIONS

The present application is based upon and claims the benefit of priority to Japanese Patent Application No. 2022-037664, filed Mar. 11, 2022, the entire contents of which are incorporated herein by reference.

BACKGROUND OF THE INVENTION

Field of the Invention

The present invention relates to a printed wiring board.

DESCRIPTION OF BACKGROUND ART

Japanese Patent Application Laid-Open Publication No. 2001-203462 describes a method for manufacturing a multilayer printed wiring board, and the method includes sequentially laminating a conductor circuit and an interlayer resin insulating layer on a substrate. The entire contents of this publication are incorporated herein by reference.

SUMMARY OF THE INVENTION

According to one aspect of the present invention, a printed wiring board includes an insulating layer, a first conductor layer formed on the insulating layer, an adhesive layer formed on the first conductor layer, a resin insulating layer formed on the insulating layer such that the adhesive layer is formed between the first conductor layer and the resin insulating layer, and a second conductor layer formed on the resin insulating layer. The first conductor layer is formed such that the first conductor layer has a smooth upper surface and a smooth side surface and that the adhesive layer has a smooth film formed on the smooth upper and side surfaces, and a protruding part protruding from the smooth film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
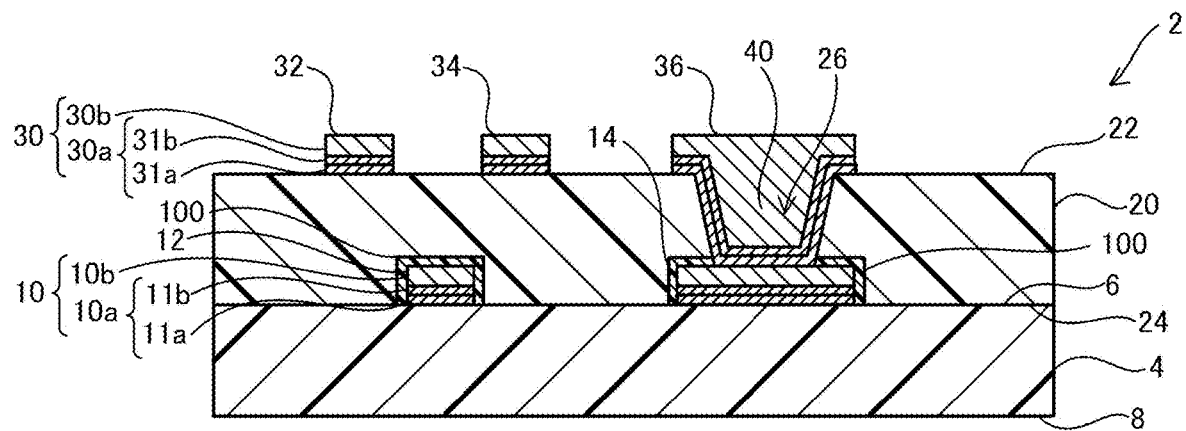
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

FIG. 1 is a cross-sectional view illustrating a printed wiring board 2 according to an embodiment of the present invention. As illustrated in FIG. 1, the printed wiring board 2 includes an insulating layer 4, a first conductor layer 10, a resin insulating layer 20, a second conductor layer 30, and a via conductor 40. The printed wiring board 2 has an adhesive layer 100 on the first conductor layer 10. The adhesive layer 100 is sandwiched between the first conductor layer 10 and the resin insulating layer 20. The first conductor layer 10 and the second conductor layer 30 are adjacent to each other. There is no conductor layer between the first conductor layer 10 and the second conductor layer 30.

The insulating layer 4 is formed using a thermosetting resin. The insulating layer 4 may be formed of a photocurable resin. The insulating layer 4 may contain inorganic particles such as silica particles. The insulating layer 4 may contain a reinforcing material such as a glass cloth. The insulating layer 4 has a third surface 6 (upper surface in the drawing) and a fourth surface 8 (lower surface in the drawing) on an opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) is formed by a first layer (11a) on the third surface 6 and a second layer (11b) on the first layer (11a). The first layer (11a) is formed of an alloy (copper alloy) containing copper, silicon and aluminum. The first layer (11a) and second layer (11b) are formed by sputtering. The second layer (11b) is formed of copper. The electrolytic plating layer (10b) is formed of copper. The first layer (11a) is in contact with the insulating layer 4. Ab upper surface and a side surface of the first conductor layer 10 are smooth. Roughness of the smooth surfaces (the upper surface and the side surface) of the first conductor layer 10 is expressed using a root mean square roughness (Rq). The root mean square roughness (Rq) of the smooth surfaces of the first conductor layer 10 is 0.18 µm or less.

The upper surface of the first conductor layer 10 is formed of a first surface and a second surface. The first surface is exposed from an opening 26 and is not covered by the adhesive layer 100. The second surface is a portion other than the first surface and is covered by the adhesive layer 100. The side surface of the first conductor layer 10 is covered by the adhesive layer 100. The adhesive layer 100 is formed of an organic material. The organic material is a nitrogen-based organic compound. The nitrogen-based organic compound is, for example, a tetrazole compound. Examples of the nitrogen-based organic compound are described in Japanese Patent Application Laid-Open Publication No. 2015-54987. The adhesive layer 100 does not cover the third surface 6 exposed from the first conductor layer 10. The adhesive layer 100 is sandwiched between the first conductor layer 10 and the resin insulating layer 20. The adhesive layer 100 adheres the first conductor layer 10 and the resin insulating layer 20 together.

Figure 2:
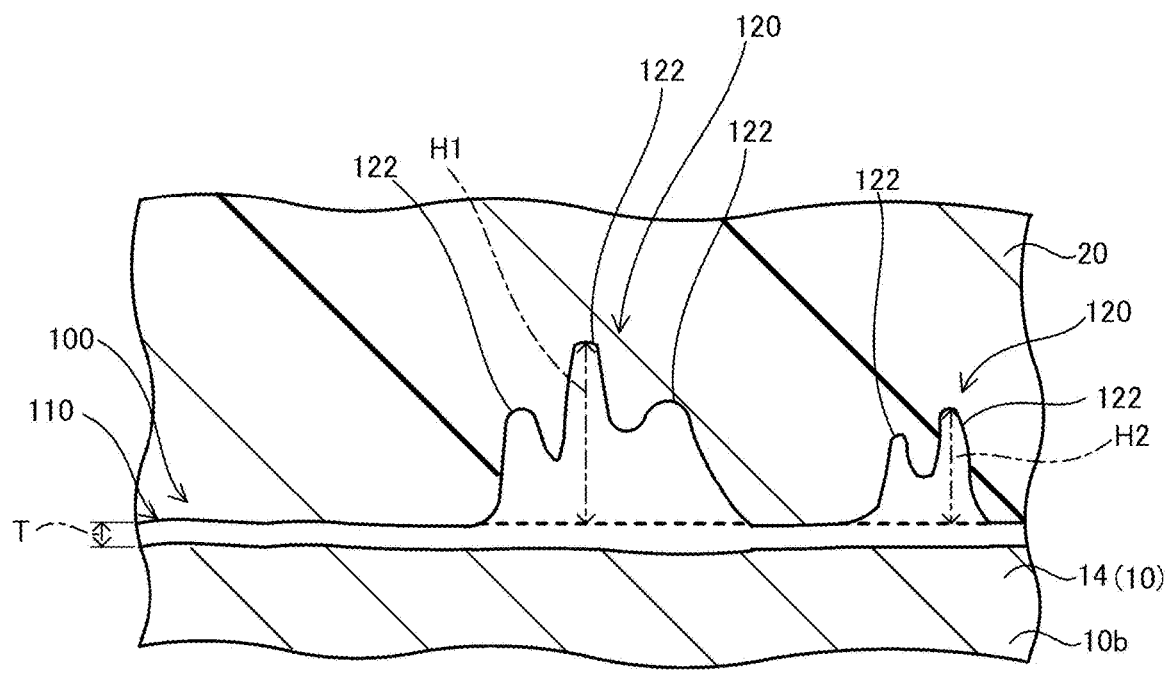
FIG. 2 is an enlarged cross-sectional view schematically illustrating a part of a printed wiring board according to an embodiment of the present invention.

FIG. 2 is an enlarged cross-sectional view illustrating a part of the adhesive layer 100 formed on the second surface in an upper surface of the pad 14. As illustrated in FIG. 2, the adhesive layer 100 is formed of a smooth film 110, which is substantially smooth, and multiple protruding parts 120 protruding from the smooth film 110. The adhesive layer 100 formed on a side surface of the pad 14 is formed of a smooth film 110 and multiple protruding parts 120 similar to the adhesive layer illustrated in FIG. 2, and has a similar shape. The adhesive layer 100 formed on an upper surface and a side surface of the signal wiring 12 is formed of a smooth film 110 and multiple protruding parts 120 similar to that illustrated in FIG. 2, and has a similar shape.

The smooth film 110 has a substantially uniform thickness (T). The thickness (T) of the smooth film 110 is 10 nm or more and 120 nm or less. A ratio (S1/S2) of an area (S1) of the smooth film 110 exposed from the protruding parts 120 to an area (S2) of the adhesive layer 100 is 0.1 or more and 0.5 or less. The smooth film 110 on the upper surface of the first conductor layer 10 is formed substantially along a shape of the upper surface of the first conductor layer 10. The smooth film 110 on the second surface of the first conductor layer 10 is formed substantially along a shape of the second surface of the first conductor layer 10. The smooth film 110 on the side surface of the first conductor layer 10 is formed substantially along a shape of the side surface of the first conductor layer 10. When undulations are formed on the upper surface and the side surface of the first conductor layer 10, the smooth film 110 follows the undulations.

The protruding parts 120 are each formed of multiple protrusions 122. Due to the multiple protrusions 122, unevenness is formed on upper surfaces of the protruding parts 120. The number of the protrusions 122 per 1 mm$^2$ is 5 or more and 15 or less. The protruding parts 120 have heights (H1, H2) between an upper surface of the smooth film 110 and top parts of the protruding parts 120. A maximum value of the heights (H1, H2) is 10 times or more and 30 times or less the thickness (T) of the smooth film 110. The heights (H1, H2) are 200 nm or more and 450 nm or less.

The resin insulating layer 20 is formed on the first conductor layer 10 via the adhesive layer 100. The resin insulating layer 20 is adhered to the first conductor layer 10 by the adhesive layer 100. The resin insulating layer 20 has a first surface 22 (upper surface in the drawing) and a second surface 24 (lower surface in the drawing) on an opposite side with respect to the first surface 22. The second surface 24 of the resin insulating layer 20 faces the first conductor layer 10. The resin insulating layer 20 has an opening 26 that expose the pad 14. The resin insulating layer 20 is formed of an epoxy resin and inorganic particles dispersed in the epoxy resin. Examples of the resin include a thermosetting resin and a photocurable resin. Examples of the inorganic particles include silica particles and alumina particles. An amount of the inorganic particles in the resin insulating layer 20 is 70 wt % or more.

No unevenness is formed on the first surface 22 of the resin insulating layer 20. The first surface 22 is not roughened. The first surface 22 is formed smooth. On the other hand, an inner wall surface of the opening 26 has unevenness. A thickness of the resin insulating layer 20 is two or more times a thickness of the second conductor layer 30. The thickness of the resin insulating layer 20 is a distance between the first surface 22 and the upper surface of the first conductor layer 10.

The second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30*a*) on the first surface 22 and an electrolytic plating layer (30*b*) on the seed layer (30*a*). The seed layer (30*a*) is formed by a first layer (31*a*) on the first surface 22 and a second layer (31*b*) on the first layer (31*a*). The first layer (31*a*) is formed of an alloy (copper alloy) containing copper, silicon and aluminum. The second layer (31*b*) is formed of copper. The electrolytic plating layer (30*b*) is formed of copper. The first layer (31*a*) is in contact with the first surface 22.

The via conductor 40 is formed in the opening 26. The via conductor 40 connects the first conductor layer 10 and the second conductor layer 30. In FIG. 1, the via conductor connects the pad 14 and the land 36. The via conductor 40 is formed of a seed layer (30*a*) and an electrolytic plating layer (30*b*) on the seed layer (30*a*).

Method for Manufacturing Printed Wiring Board

Figure 3A:
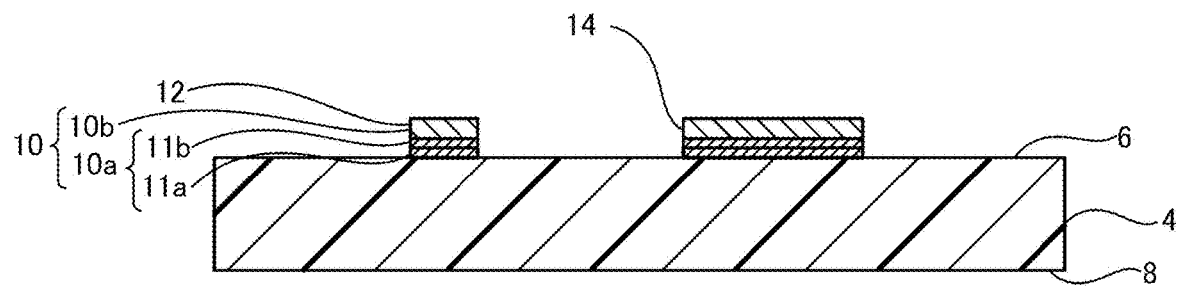
FIG. 3A is a cross-sectional view schematically illustrating a method for manufacturing a printed wiring board according to an embodiment of the present invention.

FIGS. 3A-3G illustrate a method for manufacturing the printed wiring board 2 according to an embodiment of the present invention. FIGS. 3A-3G are cross-sectional views. FIG. 3A illustrates the insulating layer 4 and the first conductor layer 10 formed on the third surface 6 of the insulating layer 4. The first conductor layer 10 is formed using a semi-additive method.

Figure 3B:
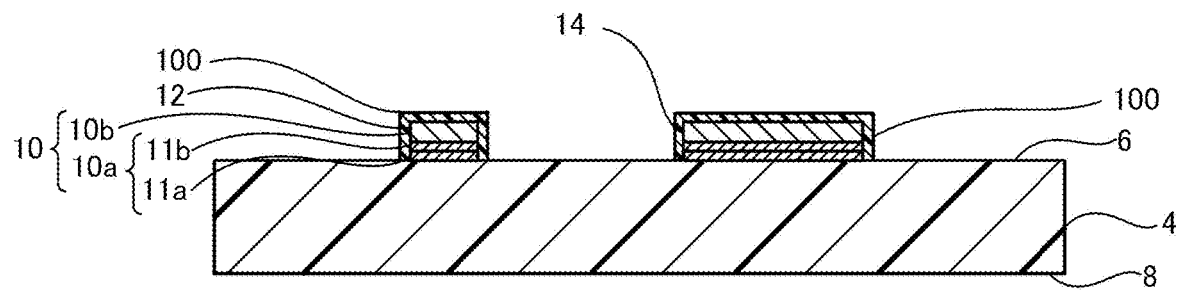
FIG. 3B is a cross-sectional view schematically illustrating a method for manufacturing a printed wiring board according to an embodiment of the present invention.

As illustrated in FIG. 3B, the adhesive layer 100 is formed on the upper surface and the side surface of the first conductor layer 10. The adhesive layer 100 is formed by immersing the intermediate substrate illustrated in FIG. 3A in a chemical solution containing a nitrogen-based organic compound. The chemical solution has a pH or 7 or less. By immersing the intermediate substrate in the chemical solution, the smooth film 110 and protruding parts 120 (FIG. 2) grow on the upper surface and the side surface of the first conductor layer 10. Before the intermediate substrate is immersed in the chemical solution, an oxide film on the upper surface and the side surface of the first conductor layer 10 is removed. In a modified embodiment the adhesive layer 100 is formed by applying a chemical solution on the first conductor layer 10. When the adhesive layer 100 is formed, the intermediate substrate is taken out from the chemical solution. The adhesive layer 100 is dried. The upper surface of the adhesive layer 100 before drying may be smooth. In this case, by the drying, a part of the adhesive layer aggregates. By the aggregating, the adhesive layer 100 including the smooth film 110 and the protruding parts 120 is formed.

Figure 3C:
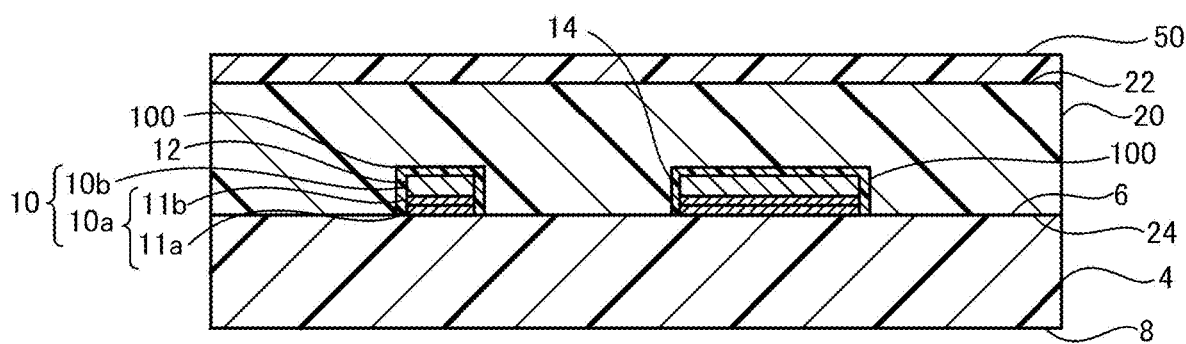
FIG. 3C is a cross-sectional view schematically illustrating a method for manufacturing a printed wiring board according to an embodiment of the present invention.

As illustrated in FIG. 3C, the resin insulating layer 20 and a protective film 50 are formed on the first conductor layer 10 covered by the adhesive layer 100. The second surface 24 of the resin insulating layer 20 faces the third surface 6 of the insulating layer 4. The protective film 50 is formed on the first surface 22 of the resin insulating layer 20.

The protective film 50 completely covers the first surface 22 of the resin insulating layer 20. An example of the protective film 50 is a film formed of polyethylene terephthalate (PET). A release layer (not shown in the drawings) is formed between the protective film 50 and the resin insulating layer 20.

Figure 3D:
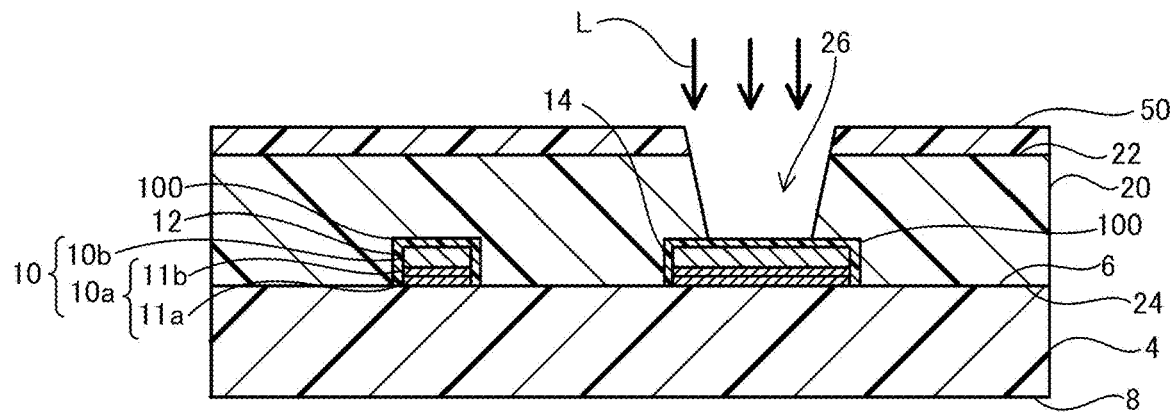
FIG. 3D is a cross-sectional view schematically illustrating a method for manufacturing a printed wiring board according to an embodiment of the present invention.

As illustrated in FIG. 3D, laser (L) is irradiated from above the protective film 50. The laser (L) penetrates the protective film 50 and the resin insulating layer 20 at the same time. The laser (L) penetrates the adhesive layer 100 covering the pad 14 and reaches the pad 14. Or, the adhesive layer 100 is not completely removed by the laser (L). A bottom of the opening 26 is formed by the adhesive layer 100. The opening 26 for a via conductor reaching the pad 14 is formed. Or, the opening 26 for a via conductor reaching the adhesive layer 100 is formed. The adhesive layer 100 covering the pad 14 is exposed by the opening 26. The laser (L) is, for example, UV laser, or $CO_2$ laser. When the opening 26 is formed, the first surface 22 is covered by the protective film 50. Therefore, when the opening 26 is formed, even when the resin scatters, adherence of the resin to the first surface 22 is suppressed.

Figure 3E:
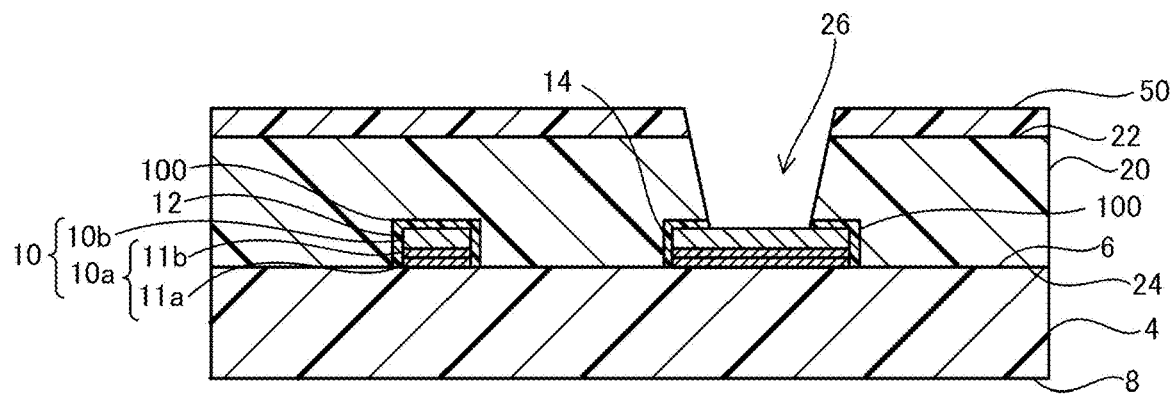
FIG. 3E is a cross-sectional view schematically illustrating a method for manufacturing a printed wiring board according to an embodiment of the present invention.

As illustrated in FIG. 3E, inside of the opening 26 is cleaned. When the adhesive layer 100 is not completely removed by the laser (L), the adhesive layer 100 exposed from the opening 26 is removed by cleaning the inside of the opening 26. The pad 14 is exposed from the opening 26. Resin residues generated when the opening 26 is formed are removed. The cleaning of the inside of the opening 26 is performed using plasma. That is, the cleaning is performed in a dry process. The cleaning can be performed using a chemical solution containing an oxidizing agent. An example of the oxidizing agent is potassium permanganate. The cleaning includes a desmear treatment. The adhesive layer 100 formed between the second surface 24 of the resin insulating layer 20 and the pad 14 is not removed. Therefore, no gap is formed between the second surface 24 of the resin insulating layer 20 and the pad 14. The epoxy resin is selectively removed by plasma. The inner wall surface of the opening 26 is roughened by the plasma. The inner wall surface of the opening 26 is formed of the resin and the inorganic particles that form the resin insulating layer 20. On the other hand, the first surface 22 of the resin insulating layer 20 is covered by the protective film 50. The first surface 22 is not affected by the plasma. No unevenness is formed on the first surface 22 of the resin insulating layer 20. The first surface 22 is not roughened. The first surface 22 is formed smooth.

Figure 3F:
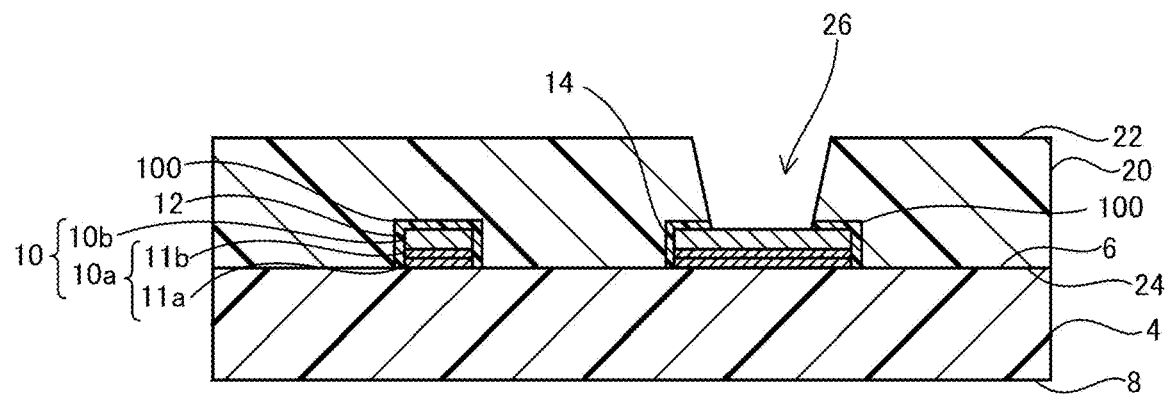
FIG. 3F is a cross-sectional view schematically illustrating a method for manufacturing a printed wiring board according to an embodiment of the present invention.

As illustrated in FIG. 3F, the protective film 50 is removed from the resin insulating layer 20. After the protective film 50 is removed, the first surface 22 of the resin insulating layer 20 is not roughened.

Figure 3G:
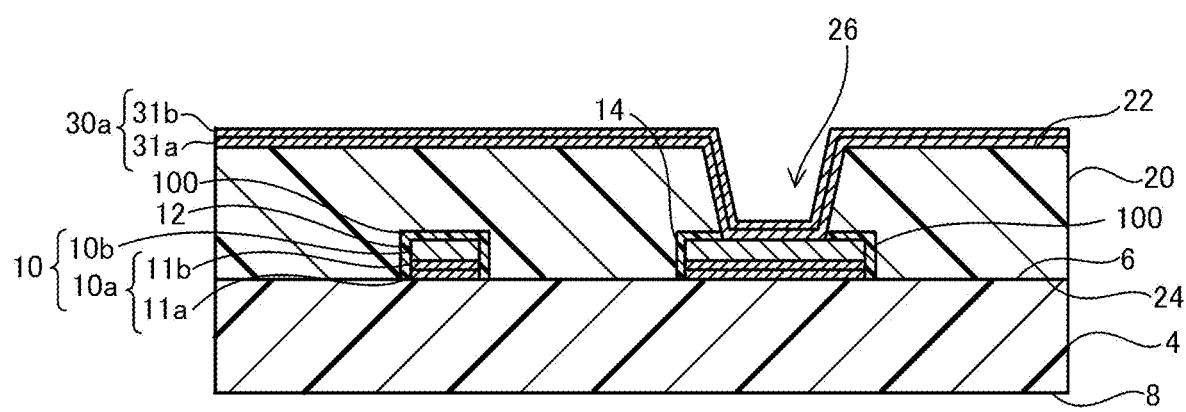
FIG. 3G is a cross-sectional view schematically illustrating a method for manufacturing a printed wiring board according to an embodiment of the present invention.

As illustrated in FIG. 3G, the seed layer (30a) is formed on the first surface 22 of the resin insulating layer 20. The seed layer (30a) is formed by sputtering. The formation of the seed layer (30a) is performed in a dry process. The first layer (31a) is formed on the first surface 22 by sputtering. At the same time, the first layer (31a) is formed on the inner wall surface and the pad 14, which are exposed from the opening 26, by sputtering. After that, the second layer (31b) is formed on the first layer (31a) by sputtering. The seed layer (30a) is also formed on the upper surface of the pad 14 exposed from the opening 26 and on the inner wall surface of the opening 26. The first layer (31a) is formed of an alloy containing copper, silicon and aluminum. The second layer (31b) is formed of copper.

A plating resist (not illustrated in the drawings) is formed on the seed layer (30a). The plating resist has openings for forming the first signal wiring 32, the second signal wiring 34, and the land 36 (FIG. 1).

The electrolytic plating layer (30b) is formed on the seed layer (30a) exposed from the plating resist. The electrolytic plating layer (30b) is formed of copper. The electrolytic plating layer (30b) fills the opening 26. The first signal wiring 32, the second signal wiring 34, and the land 36 are formed by the seed layer (30a) and the electrolytic plating film (30b) on the first surface 22. The second conductor layer 30 is formed. The via conductor 40 is formed by the seed layer (30a) and the electrolytic plating film (30b) in the opening 26. The via conductor 40 connects the pad 14 and the land 36. The first signal wiring 32 and the second signal wiring 34 form a pair wiring.

The plating resist is removed. The seed layer (30a) exposed from the electrolytic plating layer (30b) is removed. The second conductor layer 30 and the via conductor 40 are formed at the same time. The printed wiring board 2 (FIG. 1) of the embodiment is obtained.

The printed wiring board 2 of the embodiment (FIGS. 1 and 2) has the adhesive layer 100 sandwiched between the first conductor layer 10 and the resin insulating layer 20. The adhesive layer 100 adheres the first conductor layer 10 and the resin insulating layer 20 together. The adhesive layer 100 is formed of the smooth film 110, which is substantially smooth, and the protruding parts 120 protruding from the smooth film 110. The adhesive layer 100 has unevenness formed by the protruding parts 120 and the smooth film 110. The adhesive layer 100 has unevenness formed by the multiple protrusions 122. Therefore, the first conductor layer 10 and the resin insulating layer 20 are sufficiently adhered to each other via the adhesive layer 100. A high quality printed wiring board 2 is provided. For example, even when each side of the printed wiring board 2 has a length of 50 mm or more, the resin insulating layer 20 is unlikely to peel off from the first conductor layer 10. Even when each side of the printed wiring board 2 has a length of 100 mm or more, a crack caused the adhesive layer 100 is unlikely to occur in the resin insulating layer 20. Even when the first conductor layer 10 includes a conductor circuit having a width of 15 μm or less, the resin insulating layer 20 is unlikely to peel off from the first conductor layer 10. Even when the first conductor layer 10 includes a conductor circuit having a width of 10 μm or less, a crack caused by the adhesive layer 100 is unlikely to occur in the resin insulating layer 20.

In the printed wiring board 2 of the embodiment, the first surface 22 of the resin insulating layer 20 is formed of the resin. The inorganic particles are not exposed on the first surface 22. No unevenness is formed on the first surface 22. An increase in standard deviation of the relative permittivity in a portion near the first surface 22 of the resin insulating layer 20 is suppressed. The relative permittivity of the first surface 22 does not greatly vary depending on a location. Even when the first signal wiring 32 and the second signal wiring 34 are in contact with the first surface 22, a difference in propagation speed of an electric signal between the first signal wiring 32 and the second signal wiring 34 can be reduced. Therefore, in the printed wiring board of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of the logic IC can be suppressed. Even when a length of the first signal wiring 32 and a length of the second signal wiring 34 are 5 mm or more, a difference in propagation speed between the two can be reduced. Even when the length of the first signal wiring 32 and the length of the second signal wiring 34 are 10 mm or more and 20 mm or less, malfunction of the logic IC can be suppressed. A high quality printed wiring board 2 is provided.

First Modified Embodiment

In a first modified embodiment, the first layers (11a, 31a) of the seed layers (10a, 30a) are each formed of copper and a second element. The second element is selected from silicon, aluminum, titanium, nickel, chromium, carbon, oxygen, tin, calcium, and magnesium. The first layers (11a, 31a) are each formed of an alloy containing copper. The second layers (11b, 31b) are each formed of copper. An amount of copper (atomic weight %) forming each of the second layers (11b, 31b) is 99.9% or more, and preferably 99.95% or more.

Second Modified Embodiment

In a second modified embodiment, the first layers (11a, 31a) of the seed layers (10a, 30a) are each formed of any one metal of aluminum, titanium, nickel, chromium, calcium, and magnesium.

Third Modified Embodiment

The printed wiring board 2 of a third modified embodiment includes multiple conductor layers, multiple interlayer resin insulating layers, and multiple via conductors. The conductor layers and the interlayer resin insulating layers are alternately laminated. Adjacent conductor layers are connected by the via conductors. In the third modified embodiment, the number of the conductor layers is 5 or more and 20 or less. The interlayer resin insulating layers have substantially equal thicknesses. The conductor layers and the interlayer resin insulating layers can be adhered to each other with adhesive layers 100. In the embodiment and the third modified embodiment, the adhesive layers 100 have the same structure and shape. Similar to the embodiment, the adhesive layers 100 are each formed on an upper surface and a side surface of a conductor layer. The adhesive layers 100 are each sandwiched between a conductor layer and in interlayer resin insulating layer. Even when the number of the conductor layers is 5 or more, the resin insulating layers are unlikely to peel off from the conductor layers. Since the number of the conductor layers is 20 or less, a crack caused by the adhesive layers 100 is unlikely to occur in the resin insulating layers. The number of the conductor layers is preferably 10 or more. The number of the conductor layers is more preferably 15 or more. The adhesive layers 100 effectively function.

The printed wiring board 2 of FIG. 1 includes two conductor layers (the first conductor layer 10 and the second conductor layer 30). There is one first conductor layer 10. There is one second conductor layer 30. The first conductor layer 10 and the second conductor layer 30 are included in the conductor layers of the third modified embodiment. The resin insulating layer 20 of FIG. 1 is included in the interlayer resin insulating layers in the third modified embodiment. In the third modified embodiment, the conductor layers other than the first conductor layer 10 and the second conductor layer 30 are third conductor layers. In the third modified embodiment, one of the multiple interlayer resin insulating layers is formed directly on the resin insulating layer 20 and the second conductor layer 30. The interlayer resin insulating layer formed directly on the resin insulating layer 20 and the second conductor layer 30 is a first interlayer resin insulating layer. In the third modified embodiment, an adhesive layer 100 is formed between the first interlayer resin insulating layer and the second conductor layer 30. Or, no adhesive layer 100 is formed between the first interlayer resin insulating layer and the second conductor layer 30.

Fourth Modified Embodiment

In a fourth modified embodiment, a conductor layer is formed below the insulating layer 4 of the printed wiring board 2 of FIG. 1. And, the insulating layer 4 is formed by the resin insulating layer 20 of FIG. 1. The conductor layer and the first conductor layer 10 are connected by a via conductor penetrating the resin insulating layer sandwiched between the conductor layer and the first conductor layer 10. Except for forming the conductor layer below the insulating layer 4, forming the insulating layer 4 by the resin insulating layer 20, and forming the via conductor in the resin insulating layer sandwiched between the conductor layer and the first conductor layer 10, the embodiment and the fourth modified embodiment are the same.

Japanese Patent Application Laid-Open Publication No. 2001-203462 describes a method for manufacturing a multilayer printed wiring board, and the method includes: sequentially laminating a conductor circuit and an interlayer resin insulating layer on a substrate; and forming a layer containing a triazine compound on at least a part of a surface of the conductor circuit.

When a printed wiring board is manufactured using the technology of Japanese Patent Application Laid-Open Publication No. 2001-203462, the following defects are expected to occur. Japanese Patent Application Laid-Open Publication No. 2001-203462 describes a multilayer printed wiring board in FIGS. 4(c), 8(c) and 13(c) of Japanese Patent Application Laid-Open Publication No. 2001-203462. An upper-layer conductor circuitry described in these drawings is two layers. Further, it is thought that, when the upper-layer conductor circuit is laminated, a stress acting between the upper-layer conductor circuit and an interlayer resin insulating layer increases. For example, when the number of conductor layers in a build-up layer is 5 or more, peeling between the interlayer resin insulating layer and the upper-layer conductor circuit is expected to occur. It is thought that when the printed wiring board is increased in size, the stress acting between the upper-layer conductor circuit and the interlayer resin insulating layer increases. For example, when a length of each side of the printed wiring board exceeds 50 mm, peeling between the interlayer resin insulating layer and the upper-layer conductor circuit is expected to occur. For example, when the upper-layer conductor circuit includes a conductor circuit having a width of 15 μm or less, peeling between the conductor circuit having a width of 15 μm or less and the interlayer resin insulating layer is expected to occur.

A printed wiring board according to an embodiment of the present invention includes: an insulating layer; a first conductor layer formed on the insulating layer; an adhesive layer formed on the first conductor layer; a resin insulating layer formed on the insulating layer and the first conductor layer; and a second conductor layer formed on the resin insulating layer. The adhesive layer is sandwiched between the first conductor layer and the resin insulating layer, an upper surface and a side surface of the first conductor layer are smooth, and the adhesive layer is formed of a smooth film, which is substantially smooth, and a protruding part protruding from the smooth film.

A printed wiring board according to an embodiment of the present invention has the adhesive layer sandwiched between the first conductor layer and the resin insulating layer. The adhesive layer is formed of the smooth film, which is substantially smooth, and the protruding part protruding from the smooth film. The adhesive layer has unevenness formed by the protruding part and the smooth film. Therefore, the first conductor layer and the resin insulating layer are sufficiently adhered to each other via the adhesive layer. A high quality printed wiring board is provided.

Obviously, numerous modifications and variations of the present invention are possible in light of the above teachings. It is therefore to be understood that within the scope of the appended claims, the invention may be practiced otherwise than as specifically described herein.

the invention claimed is:

1. A printed wiring board, comprising:
an insulating layer;
a first conductor layer formed on the insulating layer;
an adhesive layer formed on the first conductor layer;
a resin insulating layer formed on the insulating layer such that the adhesive layer is formed between the first conductor layer and the resin insulating layer; and
a second conductor layer formed on the resin insulating layer,
wherein the first conductor layer is formed such that the first conductor layer has a smooth upper surface and a smooth side surface and that the adhesive layer has a smooth film formed on the smooth upper and side surfaces, and a protruding part protruding from the smooth film, and the adhesive layer is formed such that the smooth film has a thickness which is substantially uniform and the protruding part has a height set between an upper surface of the smooth film and a top part of the protruding part and having a maximum value in a range of 10 to 30 times the thickness of the smooth film.

2. A printed wiring board, comprising:
an insulating layer;
a first conductor layer formed on the insulating layer;
an adhesive layer formed on the first conductor layer;
a resin insulating layer formed on the insulating layer such that the adhesive layer is formed between the first conductor layer and the resin insulating layer; and
a second conductor layer formed on the resin insulating layer,
wherein the first conductor layer is formed such that the first conductor layer has a smooth upper surface and a smooth side surface and that the adhesive layer has a smooth film formed on the smooth upper and side surfaces, and a protruding part protruding from the smooth film, and the adhesive layer is formed such that the smooth film has a thickness that is substantially uniform and is in a range of 10 nm to 120 nm and that the protruding part has a height set between an upper surface of the smooth film and a top part of the protruding part and in a range of 200 nm to 450 nm.

3. A printed wiring board, comprising:
an insulating layer;
a first conductor layer formed on the insulating layer;
an adhesive layer formed on the first conductor layer;
a resin insulating layer formed on the insulating layer such that the adhesive layer is formed between the first conductor layer and the resin insulating layer; and
a second conductor layer formed on the resin insulating layer,
wherein the first conductor layer is formed such that the first conductor layer has a smooth upper surface and a smooth side surface and that the adhesive layer has a smooth film formed on the smooth upper and side surfaces, and a protruding part protruding from the smooth film, and the adhesive layer is formed such that the adhesive layer does not cover the insulating layer exposed from the first conductor layer.

4. The printed wiring board according to claim 3, wherein the adhesive layer is formed such that the smooth film on the smooth upper surface of the first conductor layer is formed substantially along a shape of the smooth upper surface of the first conductor layer.

5. The printed wiring board according to claim 4, wherein the adhesive layer is formed such that the smooth film on the smooth side surface of the first conductor layer is formed substantially along a shape of the smooth side surface of the first conductor layer.

6. The printed wiring board according to claim 3, further comprising:
a via conductor formed in an opening penetrating through the resin insulating layer and the adhesive layer such that the via conductor is connecting the first conductor layer and the second conductor layer.

7. The printed wiring board according to claim 3, wherein the adhesive layer includes an organic material.

8. A printed wiring board, comprising:
an insulating layer;
a first conductor layer formed on the insulating layer;
an adhesive layer formed on the first conductor layer;
a resin insulating layer formed on the insulating layer such that the adhesive layer is formed between the first conductor layer and the resin insulating layer; and
a second conductor layer formed on the resin insulating layer,
wherein the first conductor layer is formed such that the first conductor layer has a smooth upper surface and a smooth side surface and that the adhesive layer has a smooth film formed on the smooth upper and side surfaces, and a protruding part protruding from the smooth film, and the adhesive layer is formed such that the protruding part has a plurality of protrusions such that the protrusions are forming unevenness on an upper surface of the protruding part.

9. A printed wiring board, comprising:
an insulating layer;
a first conductor layer formed on the insulating layer;
an adhesive layer formed on the first conductor layer;
a resin insulating layer formed on the insulating layer such that the adhesive layer is formed between the first conductor layer and the resin insulating layer; and
a second conductor layer formed on the resin insulating layer,
wherein the first conductor layer is formed such that the first conductor layer has a smooth upper surface and a smooth side surface and that the adhesive layer has a smooth film formed on the smooth upper and side surfaces, and a protruding part protruding from the smooth film, and the adhesive layer is formed such that the protruding part has a plurality of protrusions and that a number of the protrusions per 1 mm² is in a range of 5 to 15.

10. A printed wiring board, comprising:
an insulating layer;
a first conductor layer formed on the insulating layer;
an adhesive layer formed on the first conductor layer;
a resin insulating layer formed on the insulating layer such that the adhesive layer is formed between the first conductor layer and the resin insulating layer;
a second conductor layer formed on the resin insulating layer;
a plurality of third conductor layers; and
a plurality of interlayer resin insulating layers laminated on the resin insulating layer and the second conductor layer such that the third conductor layers and the interlayer resin insulating layers are alternately laminated and that one of the interlayer resin insulating layers is formed directly on the resin insulating layer and the second conductor layer,
wherein the first conductor layer is formed such that the first conductor layer has a smooth upper surface and a smooth side surface and that the adhesive layer has a smooth film formed on the smooth upper and side surfaces, and a protruding part protruding from the smooth film, and the plurality of third conductor layers is formed such that a number of the third conductor layers is in a range of 3 to 18.

11. The printed wiring board according to claim 3, wherein the printed wiring board has sides each having a length of 50 mm or more.

12. The printed wiring board according to claim 3, wherein the adhesive layer is formed such that a ratio of an area of the smooth film exposed from the protruding part to an area of the adhesive layer is in a range of 0.1 to 0.5.

13. The printed wiring board according to claim 3, wherein the resin insulating layer includes a resin material and inorganic particles such that an amount of the inorganic particles in the resin insulating layer is 70 wt % or more.

14. The printed wiring board according to claim 10, wherein the adhesive layer is formed such that a ratio of an area of the smooth film exposed from the protruding part to an area of the adhesive layer is in a range of 0.1 to 0.5.

15. The printed wiring board according to claim 10, wherein the resin insulating layer includes a resin material and inorganic particles such that an amount of the inorganic particles in the resin insulating layer is 70 wt % or more.

16. The printed wiring board according to claim 10, wherein the adhesive layer is formed such that the smooth film on the smooth upper surface of the first conductor layer is formed substantially along a shape of the smooth upper surface of the first conductor layer.

17. The printed wiring board according to claim 16, wherein the adhesive layer is formed such that the smooth film on the smooth side surface of the first conductor layer is formed substantially along a shape of the smooth side surface of the first conductor layer.

18. The printed wiring board according to claim 10, further comprising:
a via conductor formed in an opening penetrating through the resin insulating layer and the adhesive layer such that the via conductor is connecting the first conductor layer and the second conductor layer.

19. The printed wiring board according to claim 10, wherein the adhesive layer includes an organic material.

20. The printed wiring board according to claim 10, wherein the printed wiring board has sides each having a length of 50 mm or more.

* * * * *